United States Patent
Helms et al.

(10) Patent No.: US 8,466,747 B1
(45) Date of Patent: Jun. 18, 2013

(54) INTEGRATED-CIRCUIT AMPLIFIER WITH LOW TEMPERATURE RISE

(75) Inventors: David R. Helms, Tyngsboro, MA (US);
John Ditri, Huntingdon Valley, PA (US);
Stuart R. Ducker, Hainesport, NJ (US);
Dana J. Sturzebecher, Cary, NC (US)

(73) Assignee: Lockheed Martin Corporation, Bethesda, MD (US)

( * ) Notice: Subject to any disclaimer, the term of this patent is extended or adjusted under 35 U.S.C. 154(b) by 95 days.

(21) Appl. No.: 13/082,800

(22) Filed: Apr. 8, 2011

(51) Int. Cl.
*H03F 3/14* (2006.01)

(52) U.S. Cl.
USPC .......................................... 330/307; 330/302

(58) Field of Classification Search
USPC ................... 330/66, 277, 302, 307
See application file for complete search history.

(56) References Cited

U.S. PATENT DOCUMENTS

| | | | |
|---|---|---|---|
| 4,342,967 A * | 8/1982 | Regan et al. | 330/311 |
| 6,121,842 A * | 9/2000 | Adlerstein et al. | 330/307 |
| 6,249,186 B1 * | 6/2001 | Ebihara et al. | 330/277 |
| 7,126,426 B2 * | 10/2006 | Mishra et al. | 330/307 |
| 7,372,334 B2 * | 5/2008 | Blair et al. | 330/302 |
| 7,391,067 B1 | 6/2008 | Kumar | |
| 2006/0290421 A1 * | 12/2006 | Ichitsubo et al. | 330/66 |
| 2008/0303593 A1 * | 12/2008 | Knoblinger | 330/277 |

* cited by examiner

*Primary Examiner* — Khanh V Nguyen
(74) *Attorney, Agent, or Firm* — Howard IP Law Group, PC

(57) ABSTRACT

An integrated circuit comprises a GaAs substrate thermally and mechanically mounted on a SiC substrate. The GaAs substrate is doped to define first and second transistors. Circuit conductors are defined on the GaAs substrate, which conductors interconnect the source of the first transistor to neutral and the drain to the source of the second transistor. Conductors connect the gate of the second transistor to neutral, to define a cascode amplifier. The SiC substrate supports first and second matching circuits, one of which is connected to the gate of the first transistor, and the other of which is connected to the drain of the second transistor.

11 Claims, 3 Drawing Sheets

INTEGRATED-CIRCUIT AMPLIFIER WITH LOW TEMPERATURE RISE

BACKGROUND

U.S. Pat. No. 7,391,067, issued Jun. 24, 2008 in the name of Kumar, describes temperature problems associated with the use of gallium arsenide (GaAs) substrates for fabrication of planar transistors for radio-frequency (RF) use. As noted by Kumar, the term RF encompasses more than the traditional radio frequencies.

High transmit power is desired in transmit-receive (TR or T/R) modules associated with radar antennas or sonar projectors. Having the highest possible power in each module tends to reduce the number of modules associated with each array, which is a cost advantage. The high power, long duty cycles, and high voltage experienced by GaAs power amplifiers, especially in view of their relatively poor thermal conductivity, tends to promote thermal runaway or thermal avalanche, which can destroy the device. These conditions are exacerbated by the close packing of the modules required by the dimensions of antenna or projector array elements.

Improved or alternative integrated circuits are desired.

SUMMARY

An amplifier according to an aspect of the disclosure comprises a SiC substrate, which may be planar. The amplifier further comprises a planar GaAs structure, one side of which defines a transistor amplifier circuit, and the other side of which is mounted in, adjacent to, or on a side of, the SiC substrate. A matching circuit, which may be an impedance matching circuit, is supported by the side of the SiC substrate and is electrically coupled to the transistor amplifier circuit. In a preferred embodiment, the amplifier circuit includes first and second transistors in a cascode configuration which may include an electrical coupling between the drain of the first transistor and the source of the second transistor. The amplifier may include an electrical connection between the matching circuit and one of a gate of the first transistor and a drain of the second transistor. In a desirable embodiment, the thickness of the planar GaAs structure is less than 0.003 inch and the SiC substrate has a thickness no greater than 0.010 inch. The layout of the source and drain regions on the side of the planar GaAs structure may be zig-zag.

An integrated-circuit amplifier according to another aspect of the disclosure comprises a generally planar SiC substrate defining a surface, and a planar GaAs substrate defining integrated first and second transistors, each including source, gate and drain electrodes, and also defining integrated electrical interconnection extending between the drain of the first transistor and the source of the second transistor. The GaAs substrate is mounted on a first portion of the surface of the SiC substrate. An integrated matching circuit is defined on a second portion of the SiC substrate. An electrical interconnection extends between the integrated matching circuit and one of the gate of the first transistor and the drain of the second transistor. In a preferred embodiment of this aspect, a second integrated matching circuit is defined on a third portion of the SiC substrate. An electrical interconnection is provided between the second integrated matching circuit and the other one of the gate of the first transistor and the drain of the second transistor. In one version, the GaAs substrate has a thickness no greater than 0.004 inch, and the SiC substrate has a thickness no greater than 0.010 inch. In a particularly advantageous embodiment, the source and drain electrodes of the first and second transistors are laid out on the planar GaAs substrate in a zig-zag manner.

DETAILED DESCRIPTION

Figure 1A:
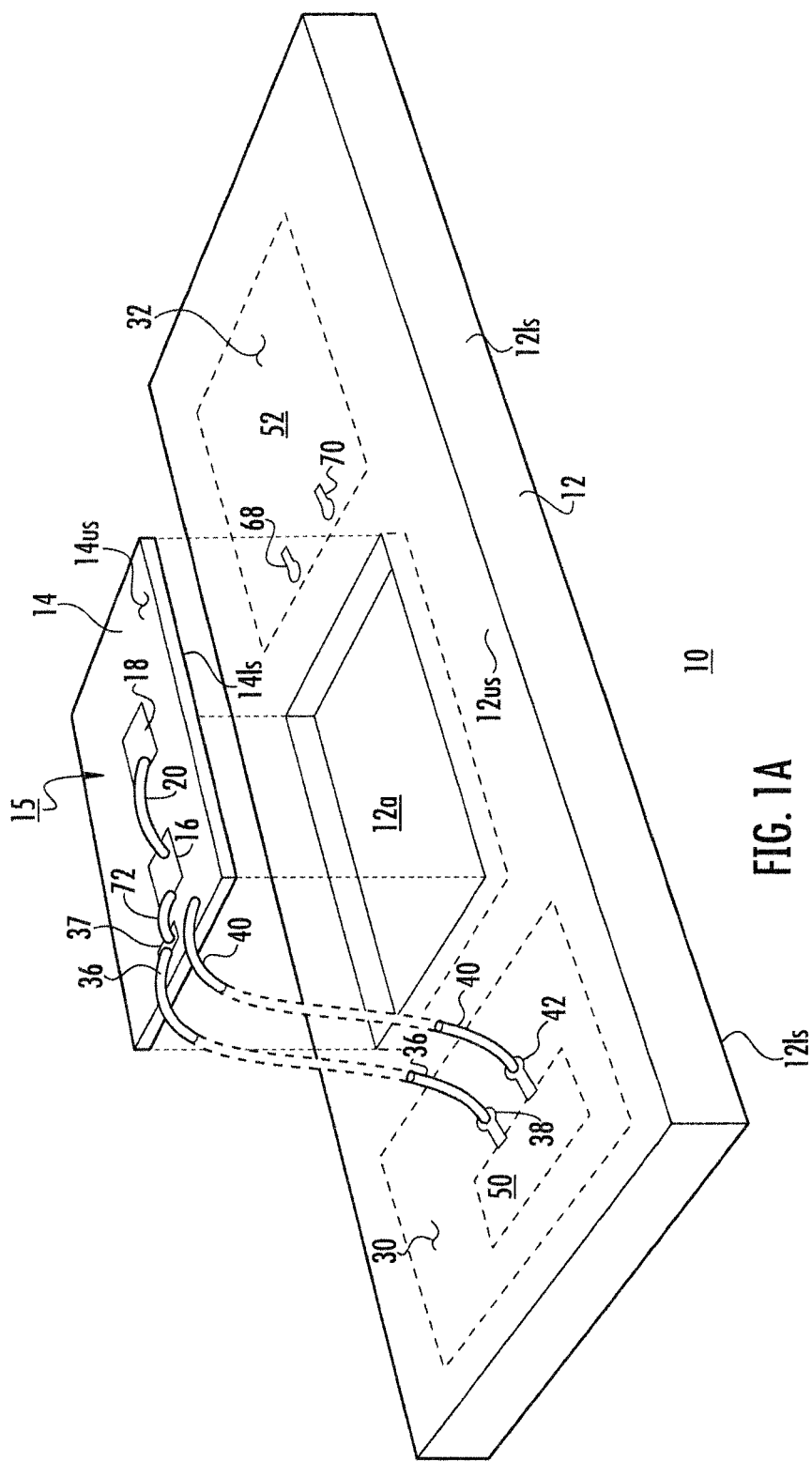
FIG. 1A is a simplified perspective or isometric view of an integrated-circuit amplifier according to an aspect of the disclosure, exploded to show relationship of parts.

In FIG. 1A, an amplifier 10 includes a silicon carbide (SiC) substrate 12 defining an upper surface 12*us* and a lower surface 12*ls*. In one embodiment, SiC substrate 12 has a thickness of 0.010 inch. The upper surface 12*us* of substrate 12 also defines a depressed region 12*a*, to which a lower surface 14*ls* of a GaAs substrate 14 may be affixed. The thickness of the GaAs substrate 14 in one embodiment is 0.003 inch. Region 12*a* is depressed below the surface 12*us*, so that the upper surface 14*us* of GaAs substrate 14 may be coplanar with upper surface 12*us* of SiC substrate 12, and so that the GaAs substrate 14 may be heat-sunk to SiC material.

GaAs substrate 14 is processed or "doped" in known fashion to define an electrical circuit 15 including plural planar transistors on its active upper surface 14*us*. As illustrated in FIG. 1A, transistors, are illustrated as 16 and 18. Those skilled in the art know that the transistors are the result of doping of the GaAs substrate 14 with dopants. According to an aspect of the disclosure, an electrical conductor 20 interconnects transistors 16 and 18 in a cascode arrangement. The cascode arrangement is advantageous because, by comparison with a grounded-source amplifier arrangement, heat generation is distributed between two transistor elements rather than being concentrated in only one element. This, in turn ameliorates the temperature rise of the transistors of the amplifier in a situation in which the same thickness and material of the substrates is involved.

FIG. 1A illustrates a first electrically conductive bond wire 36 extending from transistor 16 to a bond pad 38 on a portion 30 of the upper surface 12*us* of substrate 12. Bond wire 36 electrically connects transistor 16 with a matching circuit illustrated as 50, occupying region 30. Details of matching circuit 50 are not illustrated, but are known in the art, and require no additional explanation. A further bond wire 40 extends from a ground or neutral portion of substrate 14 to a bond pad 42 on matching circuit portion 30. Bond wires between ground or neutral portions of a substrate and corresponding portions of adjacent substrates for improved matching are known. A further region 32 on the upper surface 12*us* of substrate 12 is provided for a second matching circuit. The provision of two matching circuits makes it possible to impedance match both the input and output ports of each amplifier of substrate 14. For this purpose, a second matching circuit is illustrated as 52, and bond pads 68 and 70 are provided for connection to bond wires (not illustrated in FIG. 1A) connecting to transistor 18. Whether the bond wires connect to bonding pads on the GaAs substrate or directly to metallizations or electrodes of transistors 16 and 18, the electrical connections are established between the matching circuits and the transistors. The GaAs substrate may be affixed to the SiC substrate with high thermal conductive epoxy or with a eutectic attachment.

Figure 1B:
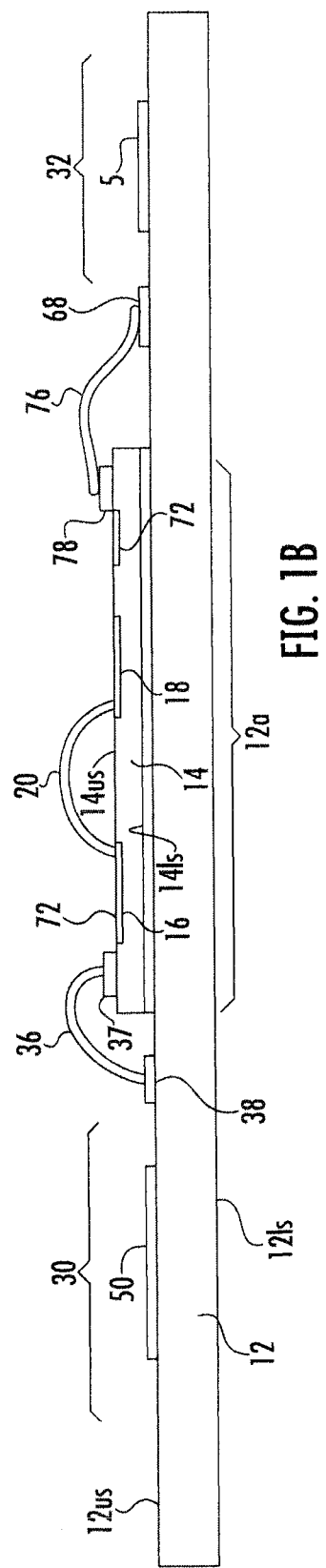
FIG. 1B is a simplified cross-sectional view of the arrangement of FIG. 1A.

FIG. 1B is a simplified cross-sectional elevation of the structure of FIG. 1A. Elements of FIG. 1A corresponding to those of FIG. 1B are designated by like reference numerals. Bond wires extend from bond or bonding pads on the silicon carbide (SiC) substrate 12 to bonding pads on the gallium arsenide (GaAs) substrate 14. More particularly, bond wire 36 is illustrated as extending from a bonding pad 38 on the SiC substrate 12 to a bonding pad 37, and bond wire 76 is illustrated as extending from a bonding pad 68 on substrate 12 to a bonding pad 77 on substrate 14. Connections from the bonding pads of substrate 14 to the electrodes of the transistors defined on substrate 14 may be by conductors, such as 72, defined near or on the surface of substrate 14, possibly with some additional bond wires. Bonding pad 37 may be considered to be the "gate" pad of transistor 16, as it is connected thereto by conductors such as 72.

Figure 1C:
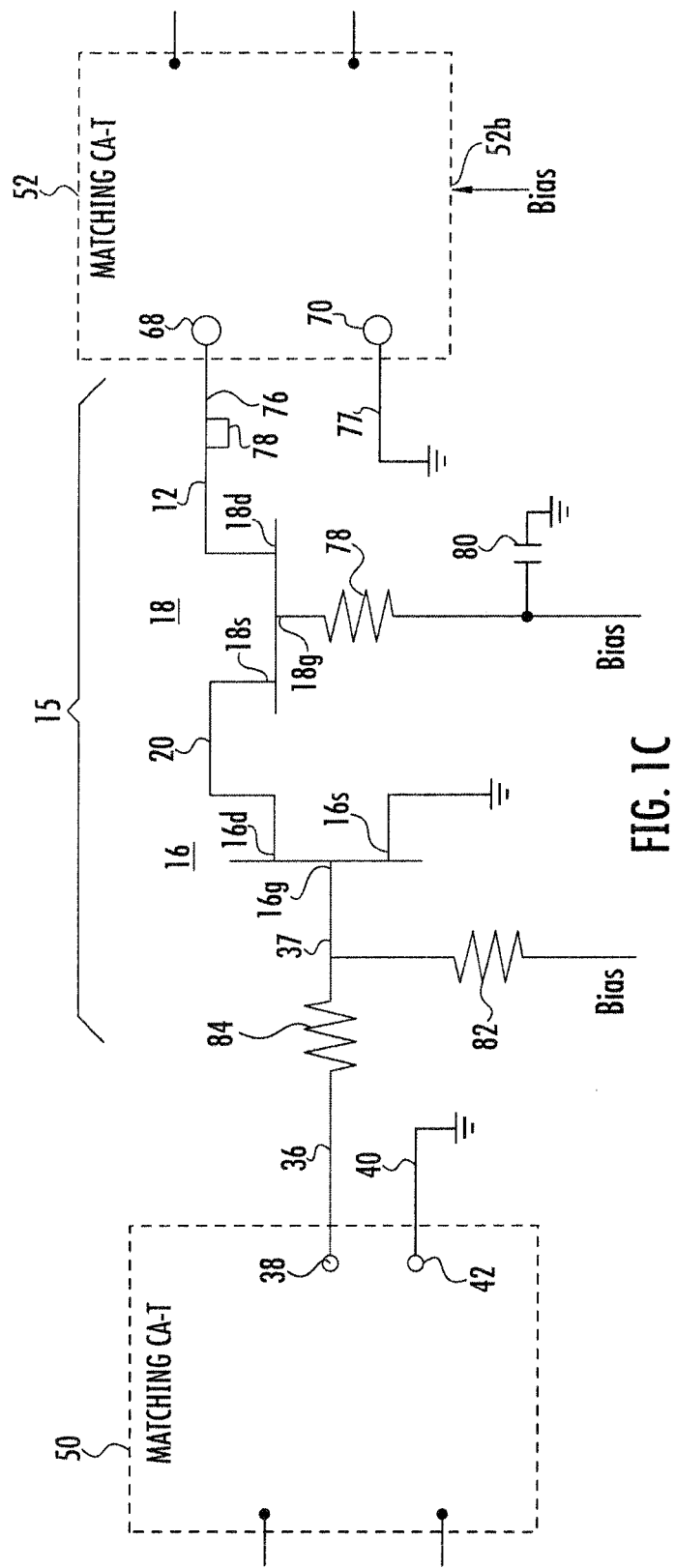
FIG. 1C is a simplified schematic diagram of a two-transistor cascode circuit which may be used in the arrangements of FIGS. 1A and 1B.

FIG. 1C is a simplified schematic diagram of amplifier 15 of FIGS. 1A and 1B optimized for radio-frequency (RF) amplification. In the past, the term "radio frequencies" was interpreted to mean a limited range of frequencies, such as, for example, the range extending from about 20 KHz to 2 MHz. Those skilled in the art know that "radio" frequencies as now understood extends over the entire frequency spectrum, including those frequencies in the "microwave" and "millimeter-wave" regions, and up to light-wave frequencies. Many of these frequencies are very important for commercial purposes, as they include the frequencies at which radar systems, global positioning systems, satellite cellular communications and ordinary terrestrial cellphone systems operate.

In FIG. 1C, elements corresponding to those of FIGS. 1A and 1B are designated by like reference alphanumerics. As illustrated in FIG. 1C, amplifier 15 includes a field-effect transistor (FET) 16 which includes source 16s, drain 16d, and gate 16g, and also includes a further FET 18 including source 18s, drain 18d, and gate 18g. FET 16 has its source 16s connected to local ground or neutral to thereby establish a common-source configuration. The gate 18g of transistor 18 is connected by a low-value resistor 78 to a source of bias having low impedance to ground, as suggested by a capacitor 80. The drain 18d of transistor 18 is connected by surface conductors 72, bonding pad 78 and bond conductor 76 to bonding pad 68 of matching circuit 52, and matching circuit 52 also has common ground or neutral with amplifier 15 by virtue of a further bonding pad 70 and bond conductor or wire 77. The gate 16g of transistor 16 is connected by way of a resistor 82 to a source of gate bias, and by way of a resistor 84 and bond wire 36 to bonding pad 38 of matching circuit 50. A connection by way of a bond wire 20 between the drain 16d of transistor 16 and the source 18s of transistor 18 defines a cascode amplifier in which the input signal is applied to gate 16g and the amplified output signal is taken from drain 18d. It should be noted that bias must be applied to the drain 18d, and it may be applied to a bias input port 52b of matching circuit 52 for coupling to the drain 18d by way of a path having relatively high radio-frequency (RF) impedance, as may be provided by a coil or inductor (not illustrated). Thus, amplifier 15 of FIG. 1C receives RF input signal from a source (not illustrated) by way of input matching circuit 50, amplifies the RF signal, and applies the amplified signal through output matching filter 52 to a utilization apparatus, not illustrated. An advantage of the cascode configuration is that the applied bias voltage is divided between the two transistors, with the result that only a fraction of the applied bias is applied to each transistor. At a given current, reduction of the applied bias voltage by half reduces the dissipation in each transistor by half. Put another way, the power dissipation which would normally occur in a common-source amplifier is split in a cascode between the two transistors. This ameliorates the temperature problems associated with the use of GaAs substrates.

The thinning of the GaAs substrate reduces the thermal resistance between the transistors and the heat transfer surface of the GaAs substrate. The mounting of the thinned GaAs substrate on SiC makes the transistor arrangement able to withstand handling during fabrication. The cascode structure reduces heat concentration by distributing the heat load among two transistors. The cascode structure allows the amplifier to operate at twice the traditional voltage, thereby allowing four times the RF power. The mounting of the matching networks on the SiC portion of the structure reduces ohmic losses by about 20% by comparison with GaAs, which translates to about a 5% increase in efficiency.

An amplifier (10) according to an aspect of the disclosure comprises a SiC substrate (12), which may be planar. The amplifier (10) further comprises a planar GaAs structure (14), one side (14us) of which defines a transistor amplifier circuit (15), and the other side of which (14ls) is physically and thermally mounted in, adjacent to, or on a side (12us, 12a) of, the SiC substrate (12). A matching circuit, which may be an impedance matching circuit (30), is supported by the side (12us, 12a) of the SiC substrate (12) and is electrically coupled (50) to the transistor amplifier circuit (15). In a preferred embodiment, the amplifier circuit (15) includes first (16) and second (18) transistors in a cascode configuration which may include an electrical coupling (20) between the drain (16d) of the first transistor (16) and the source (18s) of the second transistor (18). The amplifier (15) may include an electrical connection (38, 36, 37, 72) between the matching circuit (30) and one of a gate (16g) of the first transistor (16) and a drain (18d) of the second transistor (18). In a desirable embodiment, the thickness of the planar GaAs structure is less than 0.003 inch and the SiC substrate has a thickness no greater than 0.010 inch. The layout of the source regions on the side of the planar GaAs structure (14) may be zig-zag.

An integrated-circuit amplifier according to another aspect of the disclosure comprises a generally planar SiC substrate (12) defining a surface (12us), and a planar GaAs substrate (14) defining integrated first (16) and second (18) transistors, each including source, gate and drain electrodes, and also defining integrated electrical interconnection (20) extending between the drain (16d) of the first transistor (16) and the source (18s) of the second transistor (18). The GaAs substrate (14) is mounted on a first portion (12a) of the surface (12us) of the SiC substrate (12). An integrated matching circuit (50) is defined on a second portion (30) of the SiC substrate (12). An electrical interconnection (36, 76) extends between the integrated matching circuit (50) and one of the gate (16g) of the first transistor (16) and the drain (18d) of the second transistor (18). In a preferred embodiment of this aspect, a second integrated matching circuit (52) is defined on a third portion (32) of the SiC substrate (12). An electrical interconnection (76) is provided between the second integrated matching circuit (52) and the other one of the gate (16g) of the first transistor (16) and the drain (18d) of the second transistor (18). In one version, the GaAs substrate (14) has a thickness no greater than 0.004 inch, and the SiC substrate (12) has a thickness no greater than 0.010 inch. In a particularly advantageous embodiment, the source regions of the first (16) and second (18) transistors are laid out on the planar GaAs substrate (14) in a zig-zag manner.

What is claimed is:
1. An amplifier, comprising:
a SiC substrate defining a broad side;

a planar GaAs structure, one side of which defines a transistor amplifier circuit, and the other side of which is physically and thermally affixed to said broad side of said SiC substrate; and a matching circuit supported by said broad side of said SiC substrate and electrically coupled to said transistor amplifier circuit.

2. An amplifier according to claim 1, wherein said transistor amplifier circuit includes first and second transistors in a cascode configuration.

3. An amplifier according to claim 2, wherein said cascode configuration includes an electrical coupling between the drain of said first transistor and the source of said second transistor.

4. An amplifier according to claim 3, wherein: said matching circuit is an impedance matching circuit; and further comprising an electrical connection between said impedance matching circuit and one of a gate of said first transistor and a drain of said second transistor.

5. An amplifier according to claim 1, wherein the thickness of said planar GaAs structure is less than 0.003 inch.

6. An amplifier according to claim 1, wherein said matching circuit is an impedance matching circuit.

7. An amplifier according to claim 1, wherein said SiC substrate has a thickness no greater than 0.010 inch.

8. An amplifier according to claim 2, wherein the transistors define at least source regions, and the layout of said source regions on said side of said planar GaAs structure is zig-zag.

9. An integrated-circuit amplifier, said amplifier comprising:

a planar SiC substrate defining a surface;

a planar GaAs substrate defining integrated first and second transistors, each including source, gate and drain electrodes, and also defining integrated electrical interconnection between the drain of said first transistor and the source of said second transistor, said GaAs substrate being mounted on a first portion of said surface of said SiC substrate;

an integrated matching circuit defined on a second portion of said SiC substrate;

electrical interconnection between said integrated matching circuit and one of the gate of said first transistor and the drain of said second transistor.

10. An amplifier according to claim 9, further comprising a second integrated matching circuit defined on a third portion of said SiC substrate; and electrical interconnection between said second integrated matching circuit and the other one of said gate of said first transistor and the drain of said second transistor.

11. An amplifier according to claim 9, wherein said GaAs substrate has a thickness no greater than 0.004 inch.

* * * * *